United States Patent [19]
Kondoh et al.

[11] Patent Number: 5,406,136
[45] Date of Patent: Apr. 11, 1995

[54] HIGH SPEED ECL OUTPUT CIRCUIT HAVING REDUCED POWER CONSUMPTION

[75] Inventors: Harufusa Kondoh; Hisayasu Sato, both of Hyogo, Japan

[73] Assignee: Mitsubishi Denki Kabushiki Kaisha, Tokyo, Japan

[21] Appl. No.: 58,063

[22] Filed: May 10, 1993

[30] Foreign Application Priority Data

May 15, 1992 [JP] Japan .................................. 4-123136

[51] Int. Cl.⁶ .............................................. G05F 1/10
[52] U.S. Cl. .................................... 327/544; 327/108; 327/542
[58] Field of Search ...................... 307/296.7, 570, 495, 307/455, 467, 246, 296.6, 475, 296.3

[56] References Cited

U.S. PATENT DOCUMENTS

| | | | |
|---|---|---|---|
| 4,471,241 | 9/1984 | Nagano ................................. | 307/475 |
| 4,782,251 | 11/1988 | Tsugaru et al. ..................... | 307/475 |
| 4,912,347 | 3/1990 | Morris .................................. | 307/475 |
| 5,001,362 | 3/1991 | Tran ..................................... | 307/296.7 |
| 5,041,743 | 8/1991 | Matsumoto .......................... | 307/475 |
| 5,173,623 | 12/1992 | Chan et al. .......................... | 307/570 |
| 5,214,328 | 5/1993 | Ohi ...................................... | 307/296.7 |

OTHER PUBLICATIONS

"A 10K-Gate 950-MHz CML Demonstrator Circuit Made with a 1-μm Trench-Isolated Bipolar Silicon Technology", by Maurice P. Depey et al, IEEE Journal of Solid-State Circuits, vol. 24, No. 3, Jun. 1989, pp. 552–557.

"A 50-ps 7k-Gate Masterslice using Mixed Cells Consisting of an NTL Gate and and LCML Macrocell", by Haruhiko Ichino et al, IEEE Journal of Solid-State Circuits, vol. SC-22, No. 2, Apr. 1987, pp. 202–207.

*Primary Examiner*—Timothy P. Callahan
*Assistant Examiner*—My-Trang Nu Ton
*Attorney, Agent, or Firm*—Lowe, Price, LeBlanc & Becker

[57] ABSTRACT

The output circuit according to the present invention includes a bipolar transistor ($Q_1$), a resistance ($R_1$) and a constant current source. The transistor ($Q_1$) has its collector connected to a power supply node ($V_{CC}$), its emitter connected to an output node ($D_0$), and its base connected to the other end of the resistance ($R_1$). The resistance ($R_1$) has one end connected to the power supply node ($V_{CC}$). The constant current source is connected between a power supply node ($V_{EE}$) and the base of the transistor ($Q_1$) and is turned on/off in response to an input signal (IN) to generate a current ($I_1$) for bringing output into a low level only in the on state. The constant current source does not generate the current ($I_1$) at the time of output of a high level, and causes the current ($I_1$) to flow through the resistance ($R_1$) only at the time of output of a low level. As a result, power consumption can be reduced.

12 Claims, 12 Drawing Sheets

HIGH SPEED ECL OUTPUT CIRCUIT HAVING REDUCED POWER CONSUMPTION

BACKGROUND OF THE INVENTION

1. Field of the Invention

The present invention relates generally to output circuits of integrated circuit devices, and more particularly, to an ECL output circuit.

2. Description of the Background Art

With recent progress of a semiconductor technology, a higher speed and higher integration density are required. In order to satisfy such requirements, an emitter coupled logic (hereinafter referred to as an "ECL") circuit is used. An ECL output circuit is used only for a load especially requiring a high speed, while a complementary metal oxide semiconductor (hereinafter referred to as a "CMOS") circuit is used for a circuit which does not require a high speed.

Figure 12:
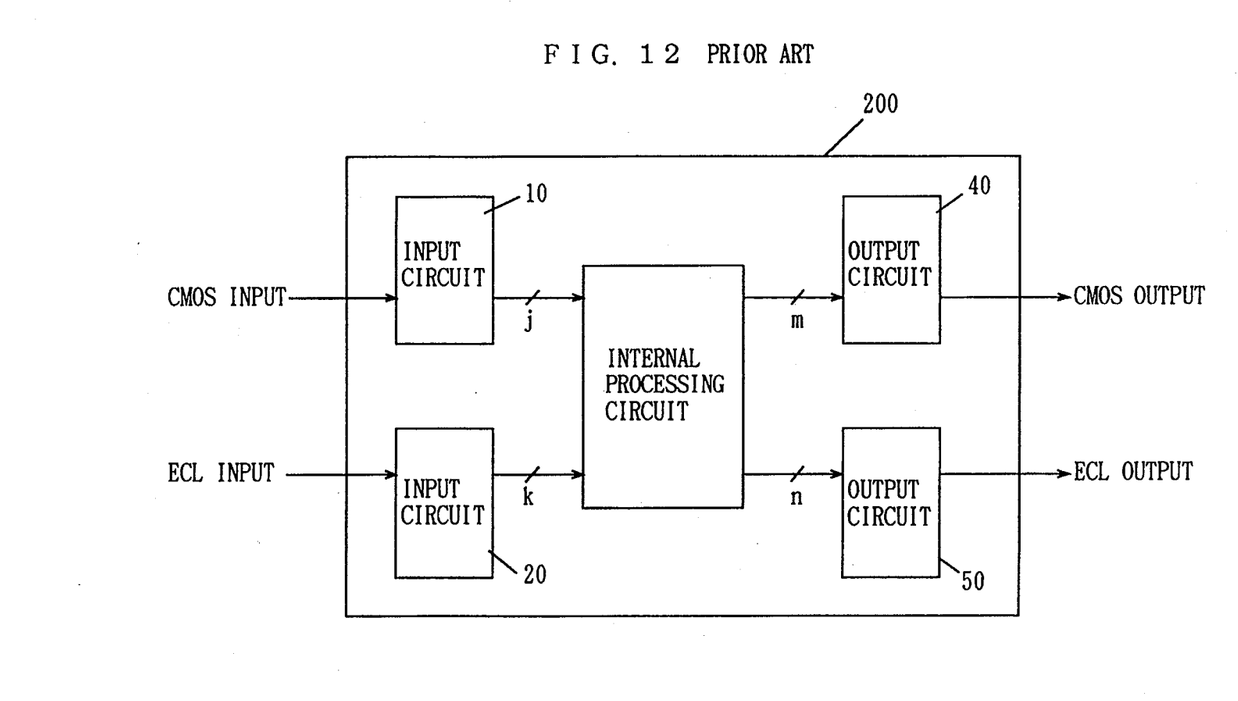
FIG. 12 is a schematic block diagram of a bipolar-CMOS integrated circuit made in combination of a CMOS logic array circuit and an ECL logic circuit.

FIG. 12 is a schematic block diagram of a bipolar-CMOS integrated circuit device made in combination of a CMOS logic array circuit and an ECL logic array circuit.

Referring to FIG. 12, an integrated circuit device 200 includes an input circuit 10, an input circuit 20, an internal processing circuit 30, an output circuit 40, and an output circuit 50. Input circuit 10 receives a signal converted to a logic level of the CMOS circuit to provide a j-bit signal to internal processing circuit 30. Input circuit 20 receives a signal converted to a logic level of the ECL circuit to provide a k-bit signal to internal processing circuit 30. Internal processing circuit 30 processes j-bit and k-bit signals from input circuits 10 and 20, respectively, to provide m-bit and n-bit signals to output circuits 40 and 50, respectively. Output circuit 40 converts the m-bit signal to a logic level corresponding to the CMOS circuit to provide the same. Output circuit 50 converts the n-bit signal to a logic level of the ECL circuit to provide the same. The signal converted to the logic level of the CMOS circuit is applied to a circuit providing a signal of a CMOS logic level, for example, a main memory operating at a relatively low speed. The signal of the ECL logic level is applied to a circuit operating at a high speed, for example, a cache memory.

Such an ECL output circuit operating at a high speed is described in FIG. 9 of "A 10k-GATE 950-MHz CML Demonstrator Circuit Made with a 1 μm Trench-Isolated Bipolar Silicon Technology", pp. 552–557, in *IEEE Journal of Solid-State Circuits*, Vol. 24, No. 3, June 1989, and in FIG. 2 of "A 50-ps 7k-Gate Masterslice Using Mixed Cells Consisting of an NTL Gate and an LCML Macrocell", pp. 202–207, in *IEEE Journal of Solid-State Circuits*, Vol. SC-22, NO. 2, April 1987.

Figure 13:
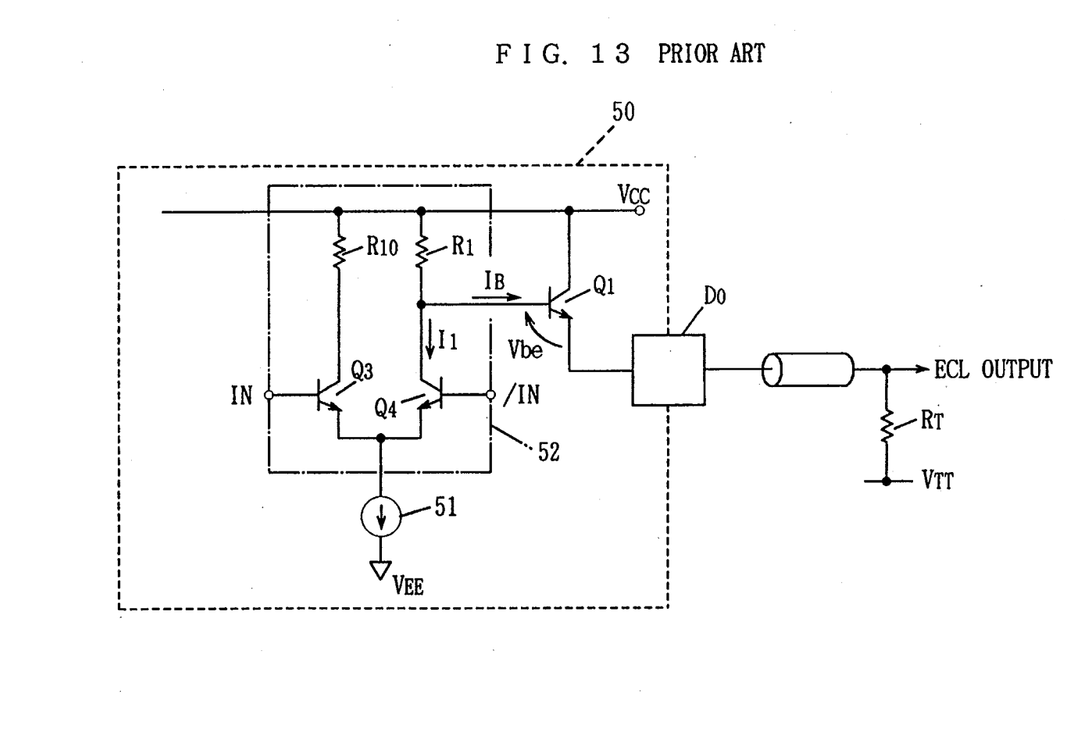
FIG. 13 is a schematic diagram of a conventional ECL output circuit.

FIG. 13 is a schematic diagram of a conventional ECL output circuit similar to the ECL circuit described in the aforementioned documents.

An ECL output circuit 50 shown in FIG. 13 includes a constant current source 51, a differential amplifier 52, an output bipolar transistor $Q_1$, a power supply node $V_{CC}$ having a first power supply voltage $V_{CC}$ supplied thereto, a power supply node $V_{EE}$ having a second power supply voltage $V_{EE}$ supplied thereto, an output node $D_0$, and input nodes IN, /IN. The output node $D_0$ is connected to a terminal voltage $V_{TT}$ through a terminal resistance $R_T$. Generally, an ECL output circuit, the power supply node $V_{CC}$, the power supply node $V_{EE}$, and the terminal voltage $V_{TT}$ are 0 V, −5.2 V, and −2 V, respectively. The bipolar transistor $Q_1$ has its collector connected to the power supply node $V_{CC}$, its emitter connected to the output node $D_0$, and its base connected to differential amplifier 52. Differential amplifier 52 includes transistors $Q_3$ and $Q_4$ and resistances $R_1$ and $R_{10}$. The transistor $Q_3$ has its collector connected to the power supply node $V_{CC}$ through the resistance $R_{10}$, its emitter connected to constant current source 51, and its base connected to the input node IN. The transistor $Q_4$ has its collector connected to the power supply node $V_{CC}$ through the resistance $R_1$, its emitter connected to constant current source 51, and its base connected to the input node /IN. Operations of the ECL output circuit shown in FIG. 13 will now be described. Input signals IN, /IN are applied to bases of transistors $Q_3$ and $Q_4$, respectively, and an output signal is taken out from the emitter of the transistor $Q_1$.

The case where a signal of a high level is applied to the input node IN and a signal of a low level is applied to the input node /IN will now be considered. Since the transistor $Q_3$ is turned on in response to the input signal IN and the transistor $Q_4$ is turned off in response to the input signal /IN, the base of the transistor $Q_1$ is connected to the power supply node $V_{CC}$ through the resistance $R_1$. A path from the power supply node $V_{CC}$ to the resistance $R_1$ to the base-emitter of the transistor $Q_1$ to the output node $D_0$ is thus configured. A current $I_B$ flows to the base of the transistor $Q_1$ through the resistance $R_1$ over the path, whereby an output voltage $V_{OH}$ of a high level can be obtained at the emitter of the transistor $Q_1$. The output voltage $V_{OH}$ is expressed by an equation (1) when $V_{be}$ represents the base-emitter voltage in the on state of the transistor $Q_1$:

$$V_{OH} = V_{CC} - R_1 \times I_B - V_{be} \quad (1)$$

where $V_{be}$ is generally 0.7 to 0.8 V.

On the other hand, when a signal of a low level is applied to the input node IN, and a signal of a high level is applied to the input node /IN, the transistor $Q_3$ is turned off, and the transistor $Q_4$ is turned on, whereby constant current source 51 is connected to the base of the transistor $Q_1$. A current $I_1$ and the base current $I_B$ generated by constant current source 51 flow to the resistance $R_1$. The output voltage $V_{OL}$ is given by an equation (2).

$$V_{OL} = V_{CC} - R_1(I_1 + I_B) - V_{be} \quad (2)$$

The output voltage $V_{OL}$ is lower than the output $V_{OH}$ of a high level by $R_1 \times I_1$. In the case of the ECL output circuit, $R_1 \times I_1$ is approximately 1 V.

As described above, the output signal is changed to $V_{OL}$ and $V_{OH}$ according to the level of the input signal.

In the conventional ECL output circuit, differential amplifier 52 is used for applying a suitable potential to the output transistor $Q_1$. Therefore, even when the output $V_{OH}$ of a high level is provided, a steady current flows through the transistor $Q_3$, causing a problem that electric power is continuously consumed. Since a recent semiconductor device has an increased number of output circuits with increase of the amount of information, a large amount of power is consumed as a whole. Therefore, it is necessary to reduce power consumption.

When a current amplification factor hfe of the output transistor $Q_1$ is not high, it is necessary to obtain a desired output voltage by increasing the base current $I_B$. However, when the base current $I_B$ is increased, a voltage drop $R_1 \times I_B$ in providing the high level $V_{OH}$ is increased. Therefore, it is not possible to obtain $V_{OH}$ of a sufficiently high level unless the resistance $R_1$ is decreased. However, when the resistance $R_1$ is decreased, the voltage drop $R_1(I_B+I_1)$ in providing the low level $V_{OL}$ is decreased. Therefore, in order to obtain the low level $V_{OL}$ of a sufficiently low level, the current $I_1$ must be increased. Therefore when the current amplification factor hfe is not high, there is a probability that power consumption in providing the low level $V_{OL}$ is increased.

In order to eliminate the problem, the current amplification factor hfe of the output transistor $Q_1$ can be increased. However, in order to increase the current amplification factor hfe of the transistor $Q_1$, it is necessary to control the concentration of impurity precisely, resulting in high costs.

SUMMARY OF THE INVENTION

One object of the present invention is to reduce power consumption at the time of output of a high level in an output circuit operating at a high speed.

Another object of the present invention is to reduce power consumption at the time of output of a low level in an output circuit operating at a high speed.

Still another object of the present invention is to reduce power consumption at the time of output of high and low levels in an output circuit operating at a high speed.

Briefly, the output circuit according to the present invention includes a first power supply node having a first supply voltage supplied thereto, a second power supply node having a second power supply voltage supplied thereto, an output node for providing an output signal of a predetermined logic level, a transistor, a resistor, and a current generator. The transistor has its collector electrode connected to the first power supply node, and its emitter electrode connected to the output node. The resistor has its one end connected to the first power supply node, and the other end connected to the base electrode of the transistor. The current generator is connected between the base electrode of the transistor and the second power supply node to be turned on/off in response to an input signal, generating a current for bringing an output signal into a low level only in the on state.

In operation, the current generator is turned on/off in response to the input signal, and generates a current for bringing the output signal into a low level only in the on state. Therefore, when the current generator is in the off state, only the resistor is connected to the base of the transistor, and the emitter of the transistor provides an output of a high level. On the other hand, when the current generator is in the on state, a current generated by the current generator flows to the resistor, generating a voltage drop to bring the output signal into a low level. When the output signal is brought into a high level, the current generator does not generate a current, whereby power consumption can be reduced.

In another aspect, the output circuit according to the present invention includes a first power supply node, a second power supply node, an output node, a transistor and a resistor. The output circuit further includes first to third switching circuits, and a constant current generator. The first switching circuit has a predetermined on-resistance value, is connected to the resistor in parallel, and is turned on/off in response to an input signal. The constant current generator is connected to the second power supply node to generate a constant current continuously. The second switching circuit is connected between the constant current generator and the base electrode of the transistor to be turned on/off in a manner complementary to the first switching circuit in response to an input signal, applying a constant current generated by the constant current generator to the base electrode of the transistor in the on state. The third switching circuit is connected between the constant current generator and the first power supply node to be turned on/off as well as the first switching circuit in response to an input signal.

In operation, because of provision of the first switching circuit which has a predetermined on-resistance value, is connected to the resistor in parallel, and is turned on/off in response to the input signal, the resistor and the on-resistance are connected in parallel to decrease the resistance value of the parallel circuit, causing the voltage drop to be small when the first switching circuit is in the on state, that is, when the output signal is brought into a high level. As a result, it is possible to make the high level sufficiently high. Conversely, when the first switching circuit is in the off state, that is, when the output signal is brought into a low level, the resistance value of the parallel circuit becomes high, whereby it is possible to make high the voltage drop at the base of the transistor. Even though the current for bringing the output signal into a low level is not increased, it is possible to make the low level of the output signal sufficiently low. As a result, it is possible to reduce power consumption at the time of output of a low level.

In still another aspect, the output circuit according to the present invention includes a first power supply node, a second power supply node, an output node, a resistor, a switching circuit, and a current generator. The switching circuit has a predetermined on-resistance value, is connected to the resistor in parallel, and is turned on/off in response to an input signal. The current generator is connected between the base electrode of the transistor and the second power supply node to be turned on/off in a manner complementary to the switching circuit in response to the input signal, generating a current for bringing the output signal into a low level only in the on state.

In operation, it is possible to render a high level and a low level of the output signal sufficiently high and low, respectively, by decreasing the resistance value by parallel connection of the resistor and the on-resistance at the time of output of a high level and by increasing the resistance value at the time of output of a low level to be higher than that at the time of the output of a high level, even if the current for bringing the output signal into the low level is not increased. Furthermore, since the current generator generates a current for bringing output into a low level only in the on state, it is possible to also reduce power consumption at the time of output of a high level.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
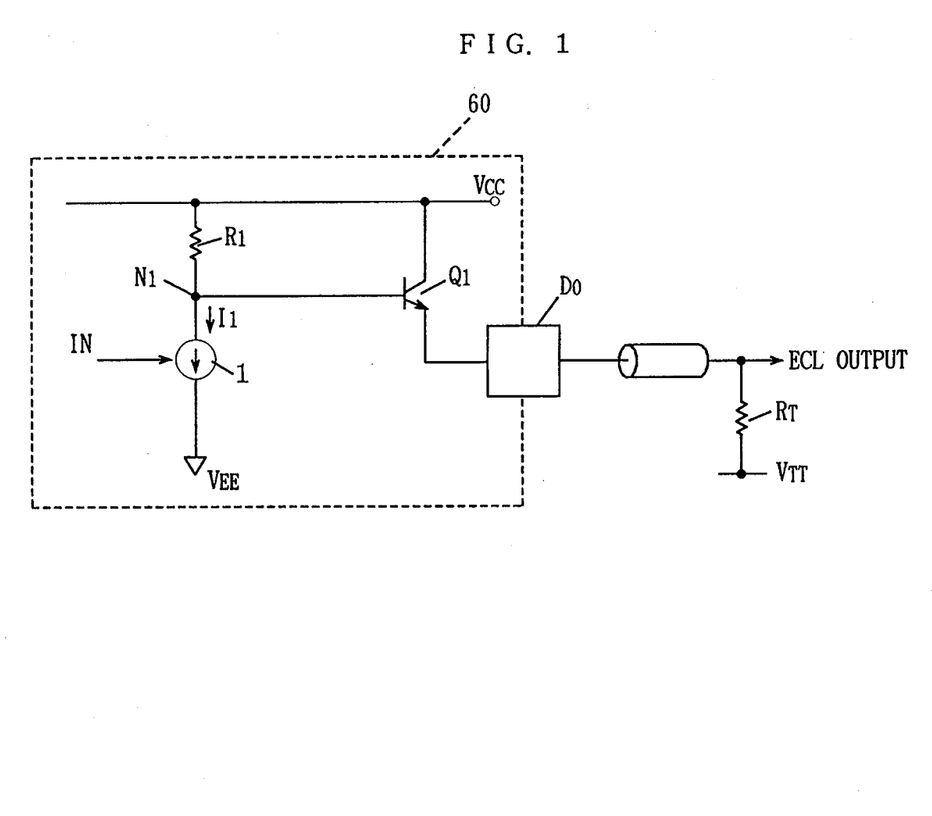
FIG. 1 is a schematic diagram of an output circuit showing one embodiment of the present invention.

FIG. 1 is a schematic diagram of a circuit showing one embodiment of the output circuit according to the present invention. An output circuit 60 shown in FIG. 1 is different from an output circuit 200 shown in FIG. 13 in that a resistance $R_1$ is provided in place of differential amplifier 52, and that a constant current source 1 is provided which applies a constant current $I_1$ only to a connection node N1 of the base of the transistor $Q_1$ and the resistance $R_1$. Since FIG. 1 is similar to FIG. 13 as for the other circuits, description will not be repeated by labeling the same reference numerals.

The resistance $R_1$ has one end connected to the first power supply source $V_{CC}$, and the other end connected to the node N1. The node N1 is connected in common to the base of the transistor $Q_1$ and constant current source 1. Constant current source 1 generates the constant current $I_1$ when the input signal IN is at a low level, and is brought into the off state when the input signal IN is at a high level.

Figure 2:
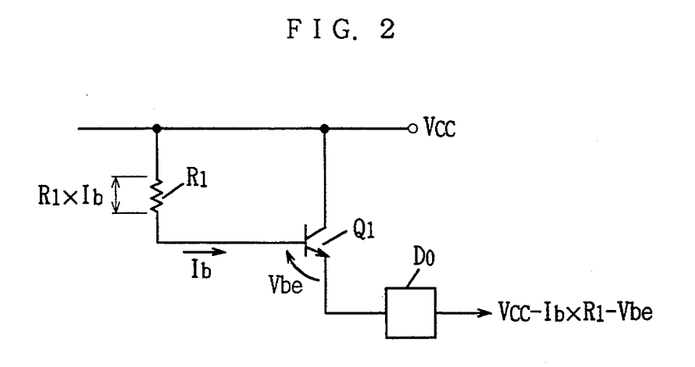
FIG. 2 is a schematic diagram of an equivalent circuit of FIG. 1 when the input signal IN is at a high level.
Figure 3:
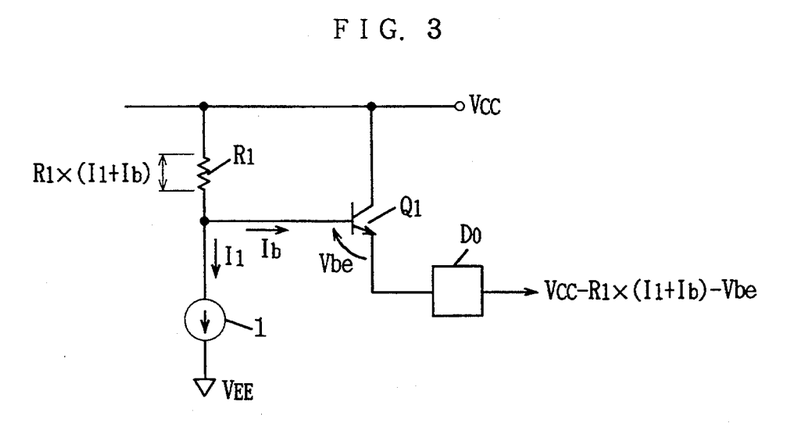
FIG. 3 is a schematic diagram of an equivalent circuit of FIG. 1 when the input signal IN is at a low level.

FIG. 2 is a schematic diagram of an equivalent circuit of FIG. 1 when the input signal IN is at a high level, while FIG. 3 is a schematic diagram of an equivalent circuit of FIG. 1 when the input signal IN is at a low level.

Referring to FIGS. 1 to 3, operations of the output circuit shown in FIG. 1 will be described.

When the input signal IN is at a high level, constant current source 1 is in the off state, causing the constant current $I_1$ not to flow anywhere. As a result, an ECL circuit 60 configures an equivalent circuit as shown in FIG. 2. The current $I_b$ is supplied to the base of the transistor $Q_1$ through the resistance $R_1$. The potential of the emitter of the transistor $Q_1$ is given by the following equation (3).

$$V_{OH} = V_{CC} - R_1 \times I_b - V_{be} \qquad (3)$$

On the other hand, when the input signal IN is at a low level, the constant current source 1 is in the on state, whereby ECL circuit 60 configures an equivalent circuit shown in FIG. 3. The base of the transistor $Q_1$ is provided with the current $I_b$ through the resistance $R_1$ as well as with the current $I_1$ from constant current source 1. As a result, the potential of the emitter of the transistor $Q_1$ is given by the following equation (4).

$$V_{OL} = V_{CC} - R_1(I_1 - I_b) - V_{be} \qquad (4)$$

Only when the input signal IN is at a low level, the current $I_1$ flows to the base of the transistor $Q_1$, and when the input signal IN is at a high level, the current $I_1$ does not flow anywhere, whereby it is possible to reduce power consumption in applying an output signal of a high level to the data output node Do. When the ECL level is provided, $R_1 \times I_1$ can be set to approximately 1 V similarly to a conventional example.

Figure 4:
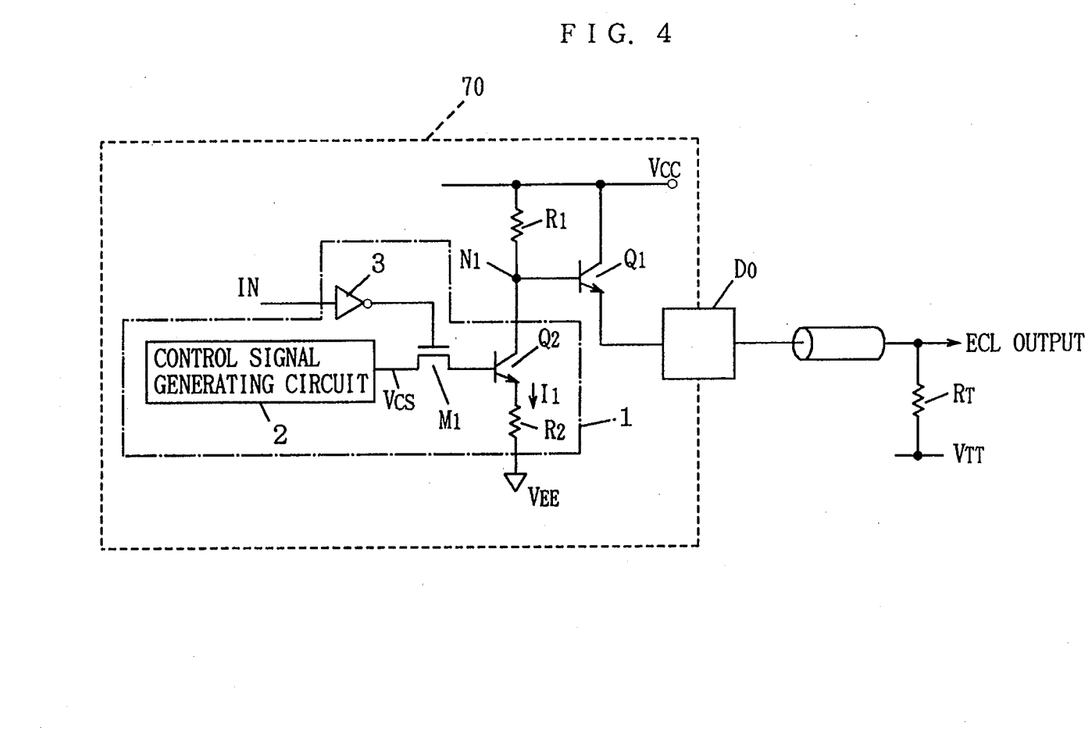
FIG. 4 is a schematic diagram of an output circuit showing a second embodiment of the present invention.

FIG. 4 is a schematic diagram of a circuit showing another embodiment of the present invention. An output circuit 70 shown in FIG. 4 includes a constant current source having a switching function as a current source of FIG. 1. Constant current source 1 includes a bipolar transistor $Q_2$, a resistance $R_2$, a control signal generating circuit 2, an NMOS transistor $M_1$, and an inverter 3. The transistor $Q_2$ has its collector connected to the node N1, its emitter connected to one end of the resistance $R_2$, and its base connected to control signal generating circuit 2 through the NMOS transistor $M_1$. The resistance $R_2$ has its other end connected to the second power supply node $V_{EE}$. The NMOS transistor $M_1$ has its gate electrode connected to the output of inverter 3. Inverter 3 has its input connected to receive the input signal IN. Control signal generating circuit 2 generates a control voltage $V_{CS}$. The control voltage $V_{CS}$ is made constant in order to make the transistor $Q_2$ serve as a constant current source. For operation at the ECL level, $V_{CS}$ is set to approximately $-3.9$ V.

Figure 5:
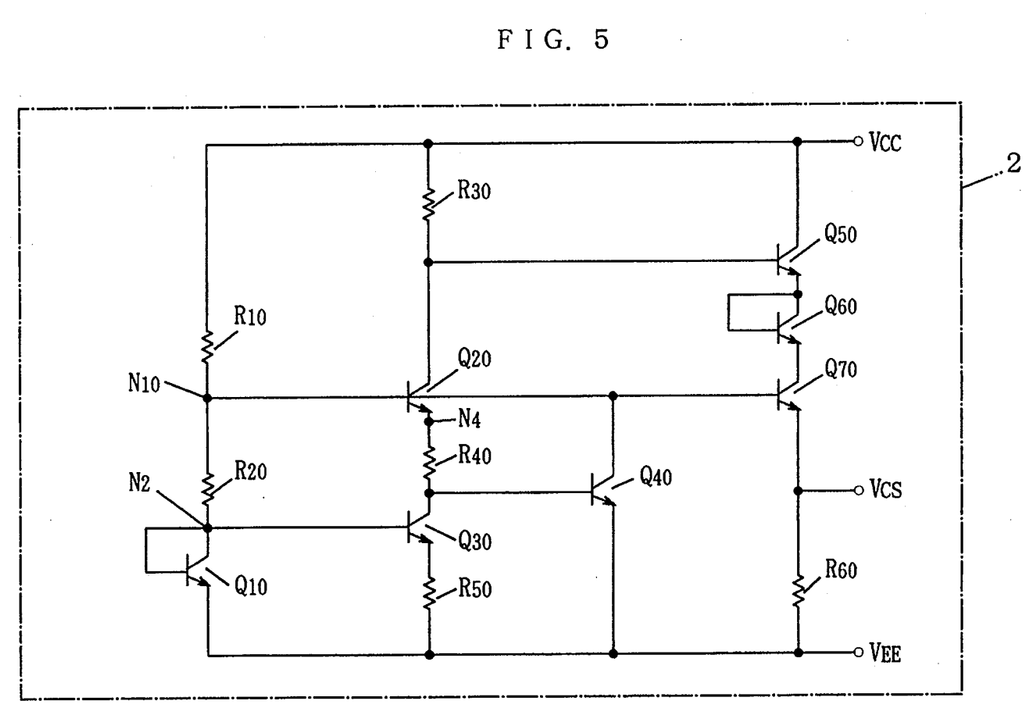
FIG. 5 is a schematic diagram of a circuit showing one example of a control voltage generating circuit 2 shown in FIG. 4.

FIG. 5 is a schematic diagram of a circuit showing one example of control voltage generating circuit 2 shown in FIG. 4. Referring to FIG. 5, control voltage generating circuit 2 includes transistors $Q_{10}$ to $Q_{70}$, resistances $R_{10}$ to $R_{60}$, a first power supply node $V_{CC}$, a second power supply node $V_{EE}$, and a control voltage output node $V_{CS}$.

How to make constant the voltage of the control voltage output node $V_{CS}$ will now be described.

The diode-connected transistor $Q_{10}$ generates a constant voltage in the on state. The difference $\Delta V_{be}$ between the constant voltage and the base-emitter voltage of the transistor $Q_{30}$ is supplied to the resistance $R_{50}$. As a result, the current flowing to the resistance $R_{50}$ becomes $\Delta V_{be}/R_{50}$. Since the emitter current is much larger than the base current, by ignoring the base current of the transistor $Q_{40}$, the potential V (N$_{10}$) of the node N$_{10}$ is given by an equation (5):

$$V(N_{10}) = V_{be}(Q_{40}) + R_{40} \cdot \Delta V_{be}/R_{50} + V_{be}(Q_{20}) \qquad (5)$$

where $V_{be}(Q_{40})$, $V_{be}(Q_{20})$ are base-emitter voltages of the transistors $Q_{40}$, $Q_{20}$, respectively.

By designing the current density of the transistors $Q_{20}$ and $Q_{70}$ to be the same, it is possible to have $V_{be}$, $(Q_{20}) = V_{be}$, $(Q_{70})$, whereby the output voltage of the control voltage output node $V_{CS}$ is given by an equation (6).

$$\begin{aligned} V(V_{CS}) &= V(N_{10}) - V_{be}(Q_{70}) \\ &= V_{be}(Q_{40}) + R_{40}/R_{50} \times \Delta V_{be} \end{aligned} \qquad (6)$$

As described above, by combining $V_{be}(Q_{40})$ having negative temperature characteristics and $\Delta V_{be} \cdot R_{40}/R_{50}$ having positive temperature characteristics, temperature compensation of the control voltage $V_{CS}$ is made, whereby the control voltage $V_{CS}$ is made constant. It should be noted that $\Delta V_{be} \cdot R_{40}/R_{50}$ is made by adjusting the resistances $R_{50}$ and $R_{10}$.

Operations of the output circuit shown in FIG. 4 will now be described. When the input signal IN is at a high level, the NMOS transistor $M_1$ is turned off. The potential of the base of the transistor $Q_2$ is reduced because of its own base current, whereby the transistor $Q_2$ is brought into the off state. On the other hand, when the input signal is at a low level, the NMOS transistor $M_1$ is in the on state, whereby the control voltage $V_{CS}$ is supplied to the base of the transistor $Q_2$. Therefore, the difference between the control voltage $V_{CS}$ and the base-emitter voltage $V_{be}$ of the transistor $Q_2$ is applied to the resistance $R_2$, whereby a constant current of $(V_{CS}-V_{be})/R_2=I_1$ flows to the resistance $R_2$.

As described above, constant current source 1 having a switching function generates a constant current only at the time of output of a low level. Therefore, it is possible to cut the bias current at the time of output of a high level, thereby making it possible to reduce power consumption.

Figure 6:
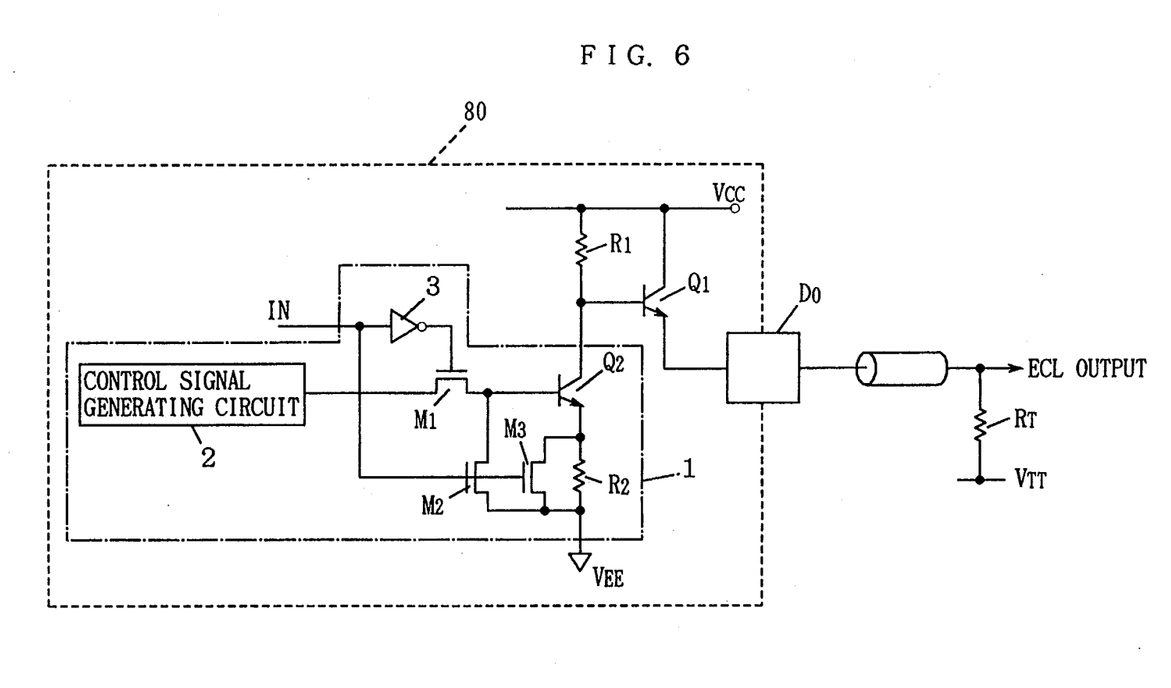
FIGS. 6 to 11 are schematic diagrams of circuits showing third to eighth embodiments of the present invention, respectively.

FIG. 6 is a schematic diagram of a circuit showing still another embodiment of the present invention. An output circuit 80 shown in FIG. 6 is different from output circuit 70 shown in FIG. 4 in that the NMOS transistor $M_2$ is provided between the base of the transistor $Q_2$ and the second power supply node $V_{EE}$, and that an NMOS transistor $M_3$ is provided between the emitter of the transistor $Q_2$ and the second power supply node $V_{EE}$.

In operation, when the input signal IN is at a high level, NMOS transistors $M_2$ and $M_3$ are turned on, and the second power supply node $V_{EE}$ and the base and the emitter of the transistor $Q_2$ are connected, whereby the base and the emitter are brought into the second power supply potential. The transistor $Q_2$ is turned off quickly. As a result, output circuit 80 can carry out a switching operation at a high speed.

Figure 7:
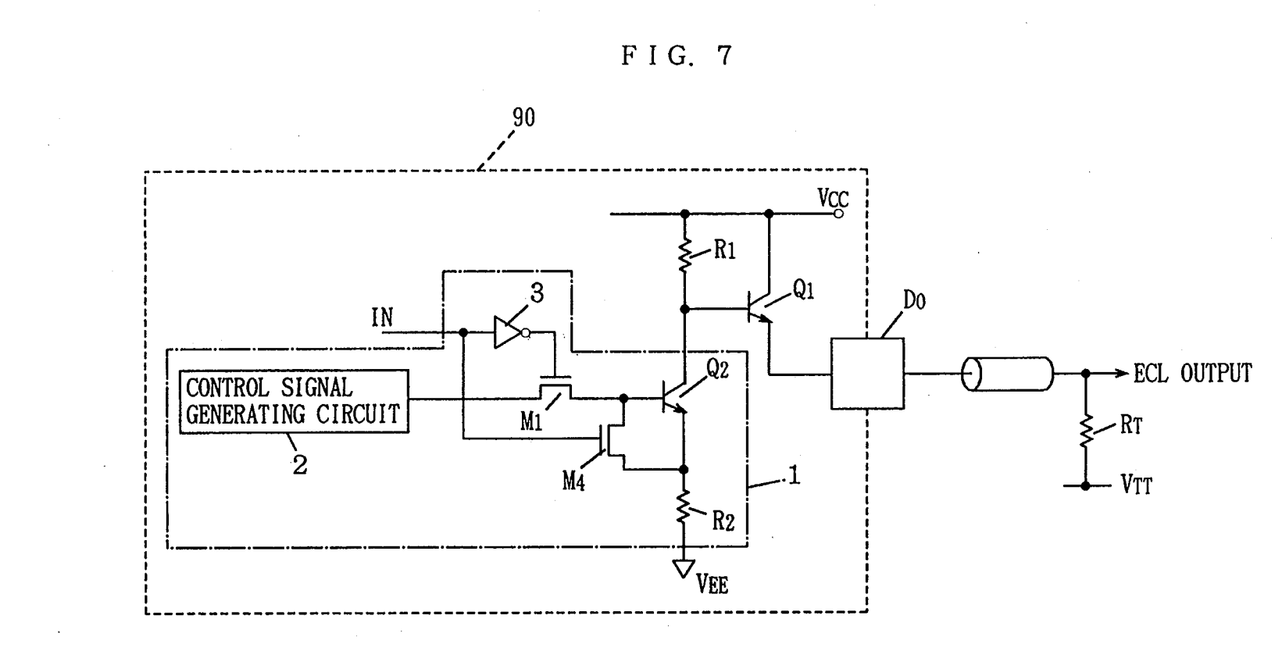

FIG. 7 is a schematic diagram showing still another embodiment of the present invention. An output circuit 90 shown in FIG. 7 is different from output circuit 80 shown in FIG. 6 in that an NMOS transistor $M_4$ connecting between the base and the emitter of the transistor $Q_2$ in response to the input signal IN is provided in place of the NMOS transistors $M_2$ and $M_3$. The NMOS transistor $M_4$ has its source/drain connected to the base of the transistor $Q_2$, its drain/source connected to the emitter of the transistor $Q_2$, and its gate connected to receive the input signal IN.

The reason why the NMOS transistor $M_4$ is connected between the base and the emitter of the transistor $Q_2$ is as follows. From the standpoint of reliability, it is preferred that a bipolar transistor has the base-emitter junction in a forward direction in its switch off operation. In the case of the output circuit of FIG. 6, when the current drivability of the NMOS transistor $M_2$ is sufficiently high compared to the NMOS transistor $M_3$, there is a possibility that the base-emitter junction is biased in the reverse direction. However, in output circuit 90 shown in FIG. 7, it is possible to completely prevent the base-emitter junction from being biased in the reverse direction by shorting the base-emitter. Therefore, there is an effect that reliability of output circuit 90 shown in FIG. 7 is improved.

Figure 8:
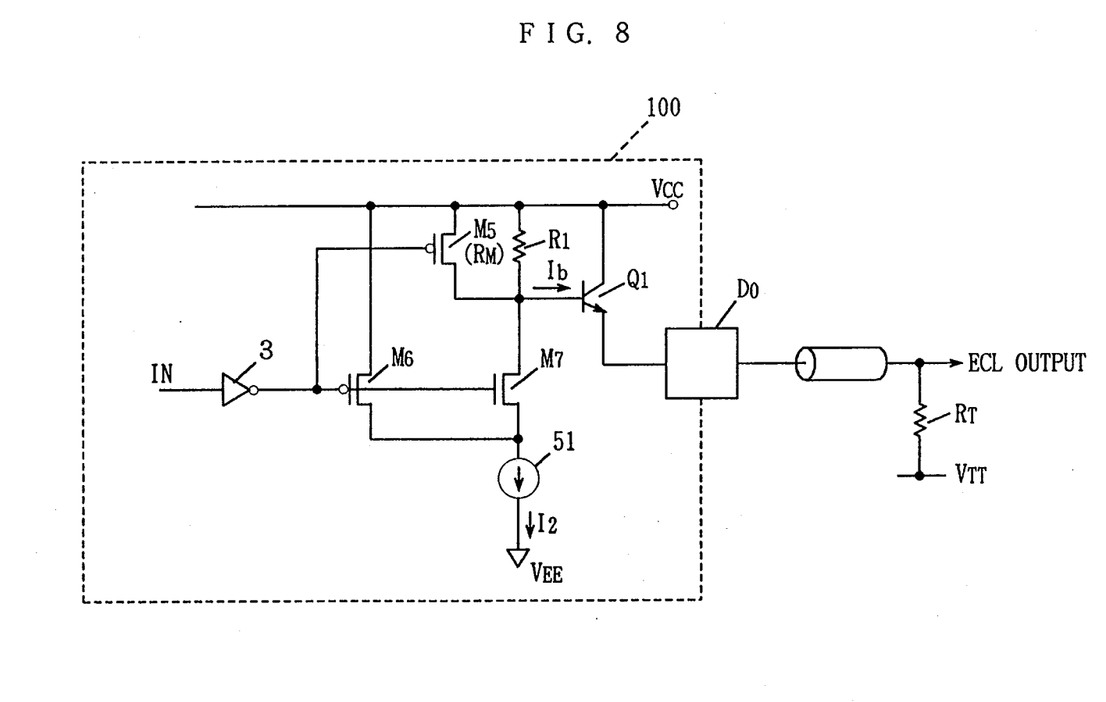

FIG. 8 is a schematic diagram of a circuit showing still another embodiment of the present invention. An output circuit 100 shown in FIG. 8 is different from the output circuit shown in FIG. 13 in that the resistance $R_1$, a PMOS transistor $M_5$ having a predetermined on-resistance value $R_M$, a PMOS transistor $M_6$, an NMOS transistor $M_7$, and inverter 3 are provided in place of differential amplifier 52. Inverter 3 inverts the input signal IN. The PMOS transistor $M_5$ is connected to the resistance $R_1$ in parallel to be turned on/off in response to the input signal IN. The PMOS transistor $M_6$ is connected between the first power supply node $V_{CC}$ and constant current source 51 to be turned on/off in response to the input signal IN. The NMOS transistor $M_7$ is connected between constant current source 51 and the base of the transistor $Q_1$ to be turned on/off in response to the inverted input signal IN. Constant current source 51 provides a steady current similarly to the conventional example.

In operation, when the input signal IN is at a high level, the NMOS transistors $M_5$ and $M_6$ are turned on, and the NMOS transistor $M_7$ is turned off. As a result, a parallel circuit configured of the resistance $R_1$ and the on-resistance $R_M$ of the PMOS transistor $M_5$, and the base of the transistor $Q_1$ are connected. The combined resistance of the parallel circuit is:

$$R_1 \cdot R_M/(R_1+R_M) \tag{7}$$

The combined resistance is smaller than the resistance $R_1$. The high level of the output signal is:

$$V_{OH}=V_{CC}-I_b \cdot R_1 \cdot R_N/(R_1+R_M)-V_{be} \tag{8}$$

Even if the resistance $R_1$ is made larger compared to the case of FIG. 1, it is possible to render the high level of the output signal sufficiently high. On the other hand, when the input signal IN is at a low level, the PMOS transistors $M_5$ and $M_6$ are turned off, and the NMOS transistor $M_7$ is turned on, whereby constant current source 51 and the base of the transistor $Q_1$ are connected. Therefore, the current $I_b$ and the current $I_2$ from constant current source 51 flow to the resistance $R_1$, causing the voltage drop at the resistance $R_1$ to be $R_1 \times (I_b+I_2)$. In the case of the ECL circuit, since the voltage drop is determined to be approximately 1 V, it is possible to reduce the current $I_2$ by increase of the resistance $R_1$, whereby power consumption can be reduced.

Output circuit 100 is particularly advantageous when the current amplification factor hfe of the transistor $Q_1$ is not high, and the base current $I_b$ is large. Since the voltage drop $R_1 \times I_b$ at the time of output of a high level is large when the base current $I_b$ is large, the high level $V_{OH}$ cannot be rendered sufficiently high unless the resistance $R_1$ is made small. Therefore, when it is desired to have sufficient voltage drop $R_1 \times (I_2+I_b)$ at the time of output of a low level, the current $I_2$ must be increased to the extent that the resistance $R_1$ is decreased. As a result, although power consumption tends to be increased, the load of the on-resistance $R_M$ of the PMOS transistor $M_5$ prevents power consumption from increasing in output circuit 100 shown in FIG. 8.

Figure 9:
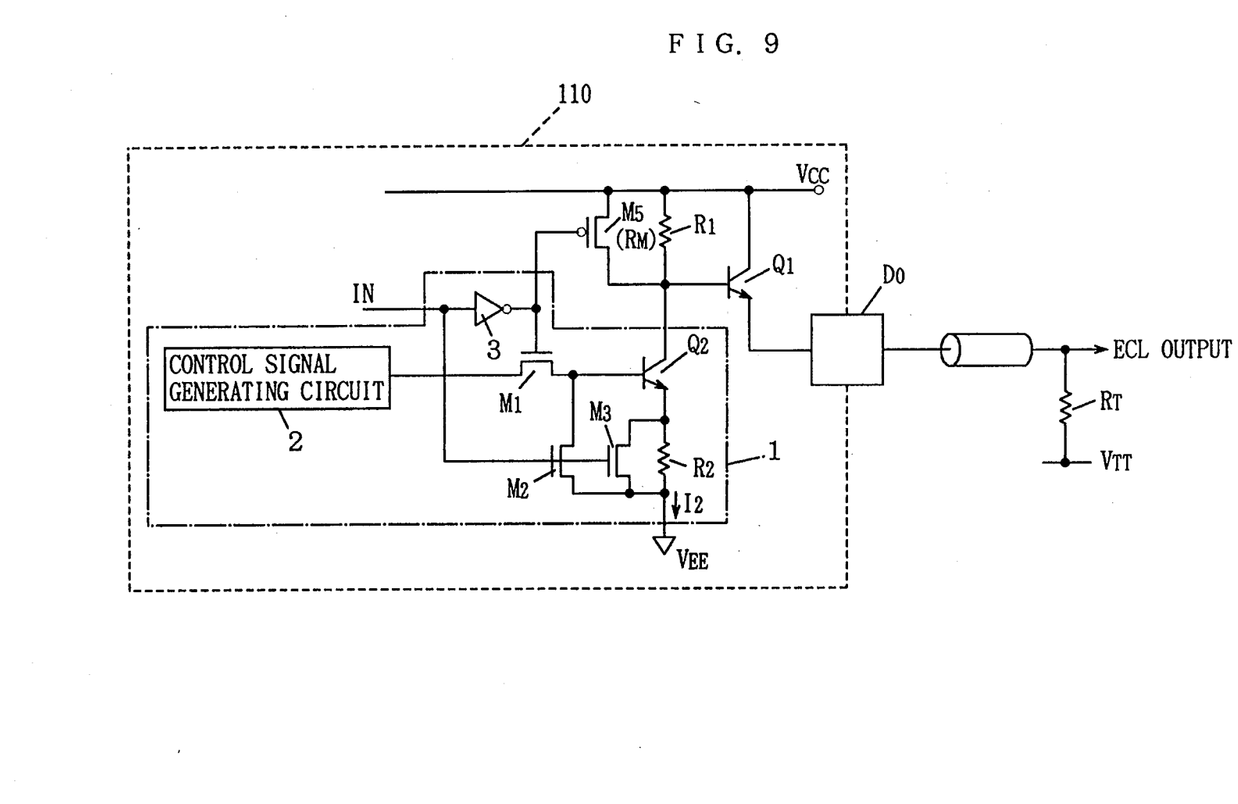

FIG. 9 is a schematic diagram of a circuit showing still another embodiment of the present invention. An output circuit 110 shown in FIG. 9 is different from output circuit 100 shown in FIG. 8 in that constant current source 1 having a switching function shown in FIG. 6 is provided in place of a circuit similar to the differential amplifier shown in FIG. 8. The current $I_2$ generated by constant current source 1 can be made smaller than the output current $I_1$ of the constant current source of FIG. 1 because of parallel connection between the PMOS transistor $M_5$ and the resistance $R_1$.

In operation, when the input signal IN is at a high level, NMOS transistors $M_2$ and $M_3$ and the PMOS transistor $M_5$ are turned on, while the NMOS transistor $M_1$ is turned off. As a result, the transistor $Q_2$ is brought into the off state quickly, constant current source 1 does not generate the current $I_2$, and the parallel circuit of the PMOS transistor $M_5$ and the resistance $R_1$ is connected to the base of the transistor $Q_1$. An equivalent circuit in this case is the same as the equivalent circuit shown in FIG. 2 having the resistance $R_1$ connected with the on-resistance $R_M$ in parallel. Therefore, even if the resistance $R_1$ is made large similarly to the output circuit of FIG. 8, it is possible to render the high level $V_{OH}$ sufficiently high, without the current $I_2$ being generated. As a result, it is possible to reduce power consumption at the time of output of the high level $V_{OH}$.

On the other hand, when the input signal IN is at a low level, NMOS transistors $M_2$ and $M_3$ and the PMOS transistor $M_5$ are turned off, while the NMOS transistor $M_1$ is turned on. Similar to the output circuit of FIG. 8, it is possible to increase the resistance value at the time of output of the low level $V_{OL}$ higher than that at the time of output of a high level. As a result, it is possible to make the voltage drop at the time of output of a low level larger, thereby decreasing the output low level sufficiently. Therefore, according to the embodiment, it is possible to render the high level sufficiently high and to render the low level sufficiently low similar to the output circuit of FIG. 8 without increasing the current $I_2$ for bringing the output signal into a low level. In addition to this, it is possible to reduce power consumption at the time of output of a high level more substantially than the output circuit of FIG. 8.

Figure 10:
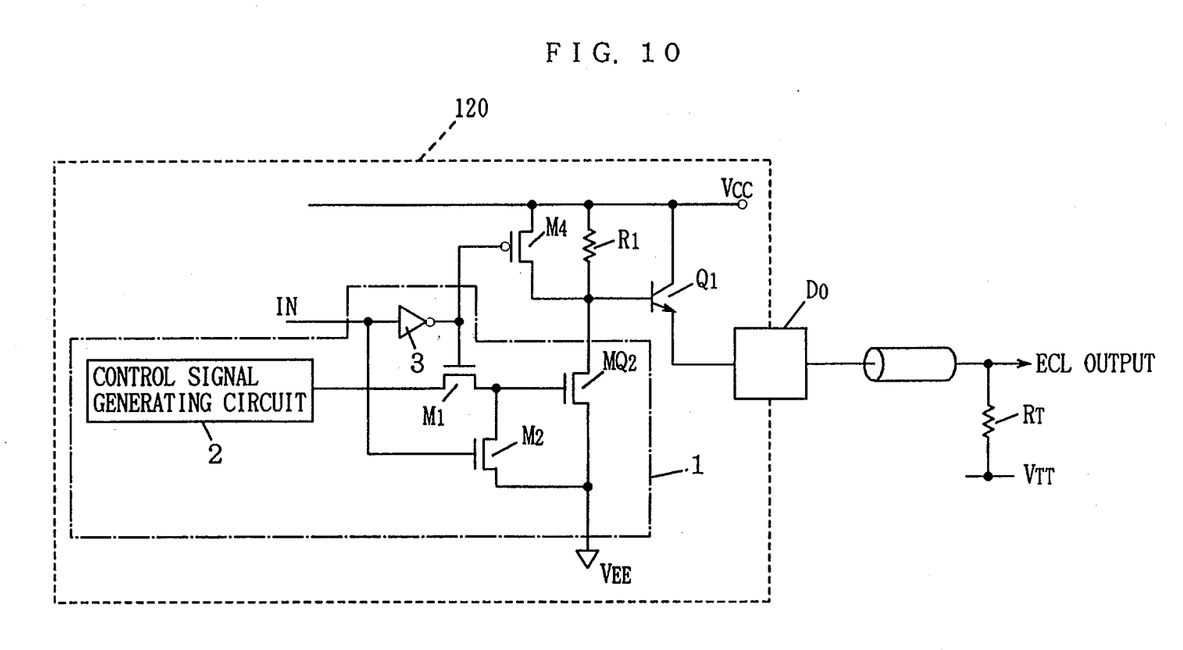

FIG. 10 is a schematic diagram of a circuit showing still another embodiment of the present invention. An output circuit 120 shown in FIG. 10 is different from output circuit 110 shown in FIG. 9 in that an NMOS transistor $MQ_2$ is provided in place of the bipolar transistor $Q_2$, the resistance $R_2$ and the NMOS transistor $M_3$. The other circuit configuration is the same as that of FIG. 9.

The NMOS transistor $MQ_2$ generates a constant current in response to the control voltage $V_{CS}$ of a current potential from control signal generating circuit 2 similarly to the bipolar transistor $Q_2$. The NMOS transistor $MQ_2$ can be used in place of the bipolar transistor since it is not necessary to generate a current constant unlike the differential amplifier. The MOS transistor has the merit of being easily made highly integrated compared to the bipolar transistor.

Figure 11:
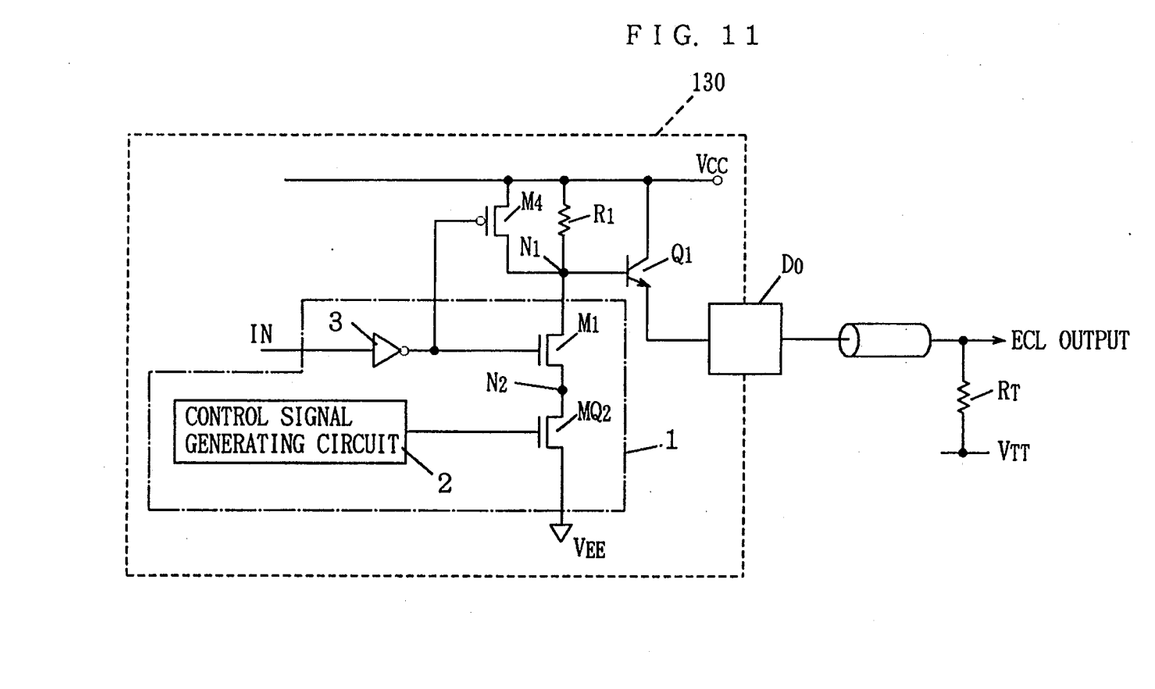

FIG. 11 is a schematic diagram of a circuit showing still another embodiment of the present invention. The output circuit 130 shown in FIG. 11 is different from output circuit 120 of FIG. 10 in that the NMOS transistor $M_2$ is removed, that the NMOS transistor $M_1$ is provided between the node N1 and the NMOS transistor $MQ_2$, and that the NMOS transistor $MQ_2$ is controlled by the control voltage $V_{CS}$ directly. NMOS transistor $M_1$ can be provided between the node N1 and the NMOS transistor $MQ_2$ for the following reason. In the case of the bipolar transistor, there is a problem of reliability when being reversely biased as described above, although the reverse bias is not especially problematic in the case of the MOS transistor. By turning off the NMOS transistor $M_1$, even if the drain voltage of the NMOS transistor $MQ_2$ is lower than the gate voltage, it does not affect the reliability.

As described above, according to the present invention, the current generating means generates a current for bringing the output signal into a low level only at the time of output of a low level, it is possible to reduce power consumption as compared to the conventional example.

By providing switching means having a predetermined on-resistance value in parallel with resistance means to be turned on/off in response to the input signal, it is possible to render the high level sufficiently high and the low level sufficiently low without increasing the current. As a result, it is possible to reduce power consumption at the time of output of a low level.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An output circuit, comprising:
   a first power supply node having a first power supply voltage supplied thereto;
   a second power supply node having a second power supply voltage supplied thereto;
   a transistor having its collector electrode connected to said first power supply node, and its emitter electrode providing an output signal of predetermined logic levels;
   resistance means having one end connected to said first power supply node, and the other end connected to a base electrode of said transistor; and
   current generating means, connected to the base electrode of said transistor and said second power supply node, for generating a current in response to an input signal, wherein said current generating means includes
   i) a current source connected between said second power supply node and the base electrode of said transistor,
   ii) control signal generating means for generating a control signal to make said current source generate the current, and
   iii) signal supplying means having switching means connected between said control signal generating means and said current source for supplying said current source with said generated control signal in response to the input signal applied to said switching means.

2. The output circuit as recited in claim 1, wherein said current source includes
   a first transistor having its collector electrode connected to the base electrode of said transistor, and its base electrode connected to receive the control signal from said signal supplying means, and
   first resistance means having one end connected to the emitter electrode of said first transistor, and another end connected to said second power supply node.

3. The output circuit as recited in claim 1, wherein said current source further includes switching means connected between the base electrode and the emitter electrode of said first transistor for being turned on/off in a complementary manner to said first transistor in response to the input signal.

4. The output circuit as recited in claim 2, wherein said current source includes first switching means connected between the base electrode of said first transistor and said second power supply node for being turned on/off in a complementary manner to said first transistor in response to the input signal, and second switching means connected between the emitter electrode of said first transistor and said second power supply node for being turned on/off as well as said first switching means in response to the input signal.

5. An output circuit, comprising:

a first power supply node having a first power supply voltage supplied thereto;

a second power supply node having a second power supply voltage supplied thereto;

a transistor having its collector electrode connected to said first power supply node, and its emitter electrode providing an output signal of predetermined logic levels;

resistance means having one end connected to said first supply node, and the other end connected to a base electrode of said transistor;

first switching means having a predetermined resistance value when said first switching means is turned on and connected to said resistance means in parallel for being turned on/off in response to an input signal;

constant current generating means connected to said second power supply node for generating a constant current continuously;

second switching means connected between said constant current generating means and the base of said transistor for being turned on/off in a complementary manner to said first switching means in response to the input signal to apply a constant current generated by said constant current generating means to the base of said transistor when said second switching means is turned on in response to the input signal; and third switching means connected between said constant current generating means and said first power supply node for being turned on/off as well as said first switching means in response to the input signal.

6. The output circuit as recited in claim 5, wherein said first and third switching means include a MOS transistor of one conductivity type, and said second switching means includes an MOS transistor of a conductivity type opposite to said one conductivity type.

7. An output circuit, comprising:

a first power supply node having a first power supply voltage supplied thereto;

a second power supply node having a second power supply voltage supplied thereto;

a transistor having its collector electrode connected to said first power supply node and its emitter electrode providing an output signal of predetermined logic levels;

resistance means having one end connected to said first power supply node and the other end connected to a base electrode of said transistor;

switching means having a predetermined resistance value when said switching means is turned on and connected in parallel to said resistance means for being turned on/off in response to an input signal; and current generating means connected between the base of said transistor and said second power supply node for being turned on/off in a complementary manner to said switching means in response to the input signal to generate a current for bringing said output signal into a low logic level at said emitter electrode only when said current generating means is turned on in response to the input signal.

8. The output circuit as recited in claim 7, wherein said current generating means includes a current source connected between said second power supply node and the base electrode of said transistor, control signal generating means for generating a control signal to make constant a current generated by said current source, and signal supplying means responsive to the input signal for being turned on/off in a complementary manner to said switching means to supply said current source with said generated control signal in the on state.

9. The output circuit as recited in claim 8, wherein said current source includes a first transistor having its collector electrode connected to the base electrode of said transistor and its base electrode connected to receive a control signal from said signal supplying means, and first resistance means having one end connected to the emitter electrode of said first transistor and another end connected to said second power supply node.

10. The output circuit as recited in claim 8, wherein said current source includes an MOS transistor having one electrode connected to the base electrode of said transistor, another electrode connected to a second power supply node, and its control electrode connected to receive a control signal from said signal supplying means.

11. The output circuit as recited in claim 7, wherein said current generating means includes a current source connected between said second power supply node and a predetermined node, control signal generating means for generating a control signal to make constant a current generated by said current source, and second switching means connected between said predetermined node and the base electrode of said transistor for being turned on/off in a complementary manner to said switching means in responsive to the input signal.

12. The output circuit as recited in claim 11, wherein said current source includes an MOS transistor, said MOS transistor having one electrode connected to said power supply node, another electrode connected to said predetermined node, and its control electrode connected to receive said control signal.

* * * * *